United States Patent
Wu

(10) Patent No.: US 8,161,360 B1
(45) Date of Patent: Apr. 17, 2012

(54) INTEGRATED INTERLEAVED CODES

(75) Inventor: Yingquan Wu, Santa Clara, CA (US)

(73) Assignee: Link_A_Media Devices Corporation, Santa Clara, CA (US)

( * ) Notice: Subject to any disclaimer, the term of this patent is extended or adjusted under 35 U.S.C. 154(b) by 854 days.

(21) Appl. No.: 12/287,053

(22) Filed: Oct. 2, 2008

Related U.S. Application Data

(60) Provisional application No. 61/001,507, filed on Oct. 31, 2007.

(51) Int. Cl.
*H03M 13/00* (2006.01)

(52) U.S. Cl. .......................... 714/781; 714/767

(58) Field of Classification Search .............. 714/784, 714/755, 786, 772, 779, 781, 767; 360/31
See application file for complete search history.

(56) References Cited

U.S. PATENT DOCUMENTS

| | | | |
|---|---|---|---|
| 5,768,296 A * | 6/1998 | Langer et al. | 714/784 |
| 5,946,328 A | 8/1999 | Cox et al. | |
| 6,275,965 B1 * | 8/2001 | Cox et al. | 714/755 |
| 6,598,202 B1 * | 7/2003 | Kim et al. | 714/786 |
| 6,903,887 B2 * | 6/2005 | Asano et al. | 360/31 |
| 7,853,857 B2 * | 12/2010 | Buckley et al. | 714/781 |
| 8,074,150 B2 * | 12/2011 | Buckley et al. | 714/781 |

OTHER PUBLICATIONS

M. A. Hassner, K. Abdel-Ghaffar, A. Patel, R. Koetter, and B. Trager, "Integrated interleaving—a novel ECC architecture", IEEE Trans. Magnetics, Mar. 2001, vol. 37, pp. 773-775.

X. Tang and R. Koetter, "On the performance of integrated interleaving coding schemes", Proc. IEEE Int. Symp. Inform. Theory, 2004, p. 328, Chicago, IL.

X. Tang and R. Koetter, "A novel method for combining algebraic decoding and iterative processing", IEEE Trans. Commun., Aug. 2007.

\* cited by examiner

*Primary Examiner* — David Ton
(74) *Attorney, Agent, or Firm* — Van Pelt, Yi & James LLP

(57) ABSTRACT

Integrated interleaved encoding is performed by obtaining a first piece of input data and a second piece of input data. The first piece of input data is systematically encoded using a first generator polynomial to obtain a first codeword. A second codeword is generated based at least in part on the second piece of input data and the first codeword. This includes by systematically encoding information based at least in part on the second piece of input data and the first codeword using a second generator polynomial. The first codeword and the second codeword are output.

23 Claims, 9 Drawing Sheets

INTEGRATED INTERLEAVED CODES

CROSS REFERENCE TO OTHER APPLICATIONS

This application claims priority to U.S. Provisional Patent Application No. 61/001,507 entitled A NEW ENCODING METHOD FOR INTEGRATED-INTERLEAVED CODES filed Oct. 31, 2007 which is incorporated herein by reference for all purposes.

BACKGROUND OF THE INVENTION

With error correcting codes, it is possible to detect and correct for certain numbers and/or types of errors in data. Integrated interleaved codes are one type of error correcting code. Integrated interleaved codes are systematic codes (i.e., the input data is included or otherwise embedded in the encoded data) and generate multiple codewords, each of which is associated with a particular level.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
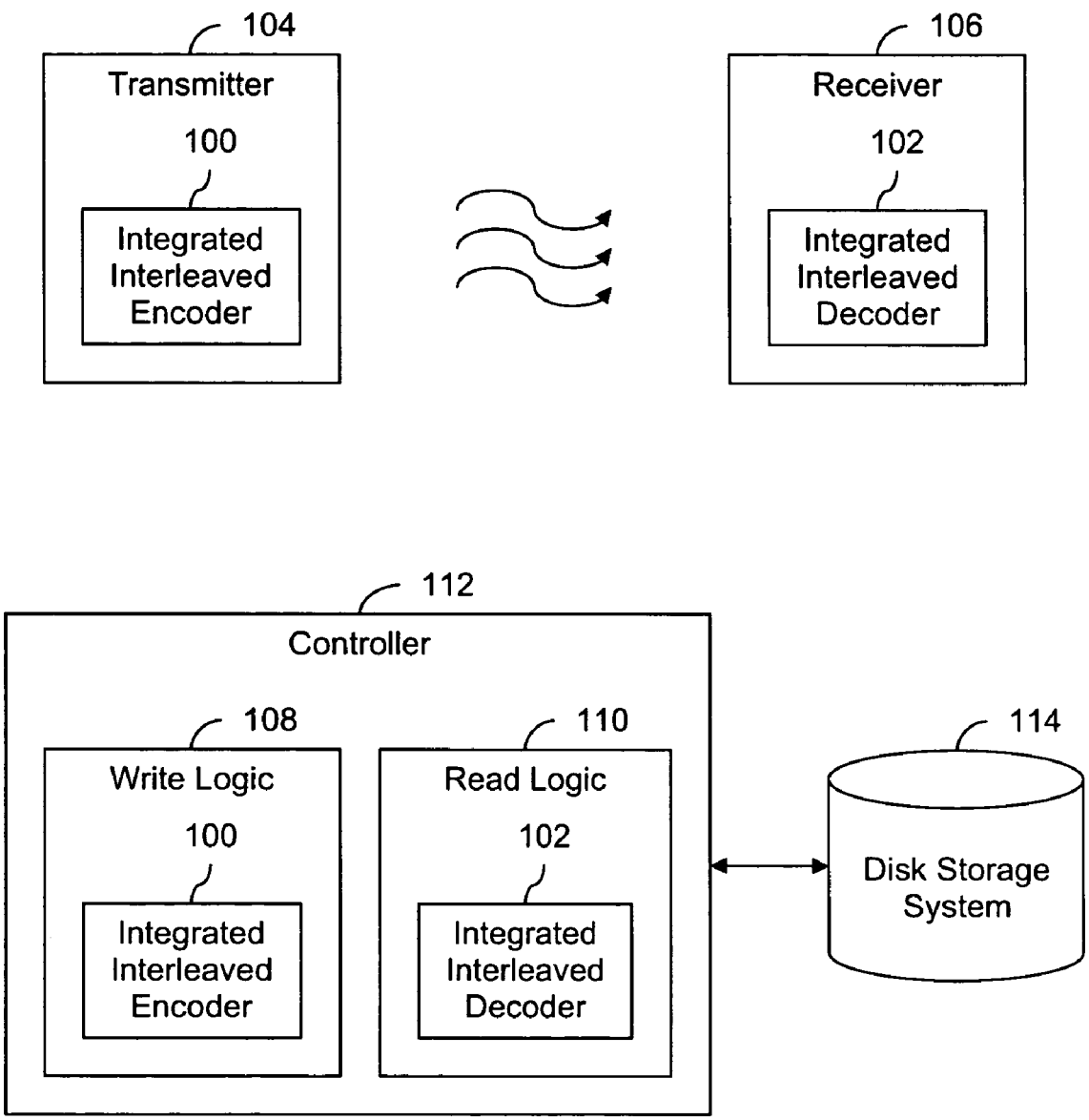
FIG. 1 is a diagram showing two example applications that use integrated interleaved coding.

FIG. 1 is a diagram showing two example applications that use integrated interleaved coding. An integrated interleaved code is an error correcting code, meaning that errors can be identified and corrected so long as the errors (e.g., the number of errors or the characteristics of the errors) fall within the correction capabilities of the particular code used. In the top example, transmitter 104 includes integrated interleaved encoder 100. Data is encoded using an integrated interleaved code and any other processing is applied as appropriate. The processed data is then transmitted over a wireless medium. Receiver 106 receives a signal and processes it, including by decoding the signal using integrated interleaved decoder 102. Typically, a wireless medium is noisy and the signal received by receiver 106 typically includes noise (also referred to as errors).

In the other example shown, integrated interleaved encoding is used in a disk drive system. Integrated interleaved encoder 100 is part of write logic 108 and integrated interleaved decoder 102 is part of read logic 110. Write logic 108 and read logic 110 are in turn part of controller 112. Controller 112 writes information to disk storage system 114 and reads it back when the stored information is desired. For example, disk storage system 114 may include one or more disks on which data is stored magnetically. Prior to storing data in disk storage system 114, data is encoded using integrated interleaved encoder 100. When data is desired, it is read back from disk storage system 114 and decoded using integrated interleaved decoder 102. Typically, a signal read back from a disk storage system has noise or errors in it and using an integrated interleaved code permits read-back errors to be corrected.

In some cases, an integrated interleaved code is used to compensate for format inefficiency (e.g., due to a short block length, to reduce hardware costs in designing codes of a relatively long block length, etc.). In some other embodiments, an integrated interleaved code is used in some other application besides the examples shown herein.

What is disclosed herein is a particular mapping or coding associated with integrated interleaved coding. In some embodiments, a second level has a single component codeword and in other embodiments the second level has two or more codewords. Some examples are described in further detail below. Compared to some other techniques, fewer and/ or simpler operations are performed (e.g., only addition as opposed to addition and subtraction, only one arithmetic operation as opposed to two arithmetic operations, etc.), corresponding to less hardware and/or shorter latency.

The general two-level integrated interleaved coding scheme of Hassner et al. is first described. Let $\{C_i\}_{i=1}^2$ be $(N,K_i,d_i)$ over the Galois field $GF(q)$ such that $C_2 \subset C_1$ and subsequently $d_2 \geq d_1$. That is, there are two codes $C_1$ and $C_2$ where code $C_2$ is (strictly) stronger than $C_1$ and correspondingly the minimum distance of code $C_2$ is greater than or equal to $C_1$. For a three level integrated interleaved coding scheme, three codes are used where $C_3 \subset C_2 \subset C_1$ and $d_3 \geq d_2 \geq d_1$. Integrated interleaved encoding can be expanded any number of levels.

$R_i \triangleq N-K_i$ and $\alpha$ is a primitive element of $GF(q)$. For purposes of explanation, cyclic component codes (which are shortened in some embodiments) are described herein where $C_i$ is associated with a generator polynomial $g_i(x)$. As used herein, a codeword vector c and its corresponding polynomial $c(x)$ are interchangeable. A two-level integrated interleaved code is defined as follows:

$$C \triangleq \left\{ c = [c_0, c_1, c_2, \ldots, c_{m-1}]^T : c_i \in C_i, \sum_{i=0}^{m-1} \alpha^{bi} c_i \in C_2, b = 0, 1, 2, \ldots, v-1 \right\}, \quad (1)$$

where $v < m \leq q-1$.

Figure 2:
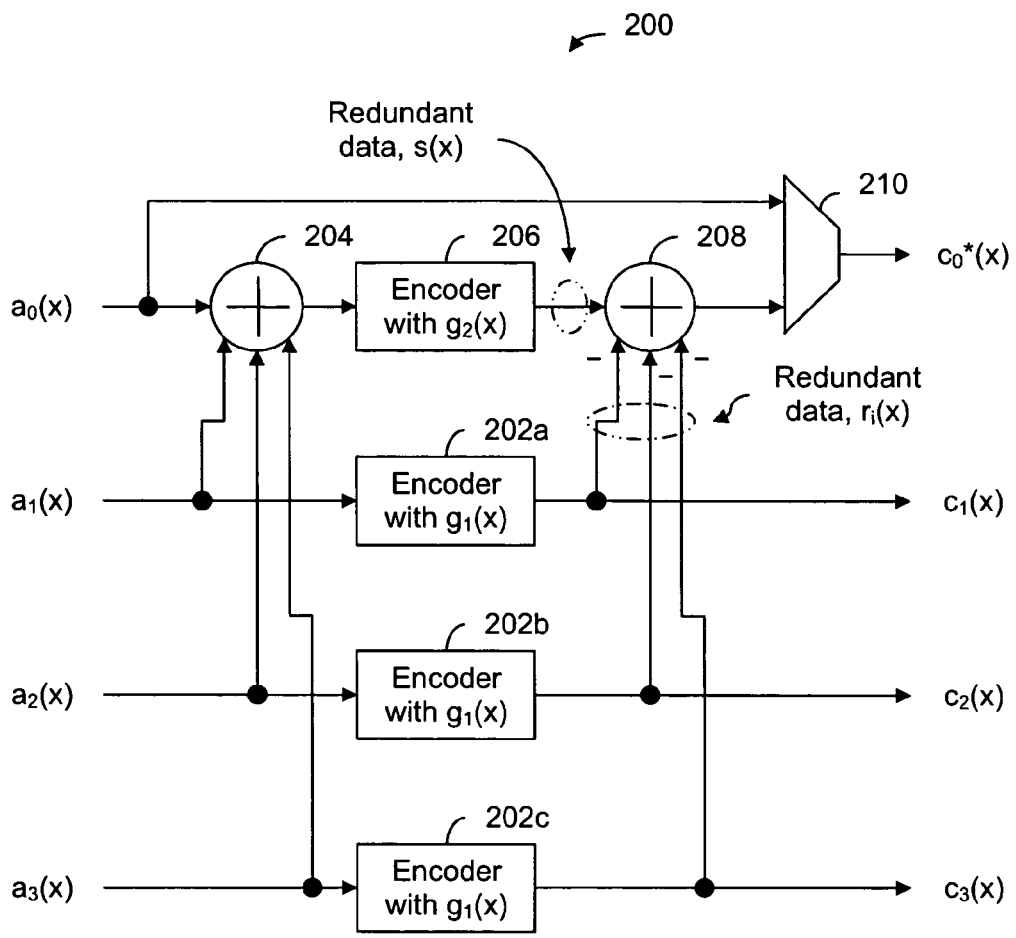
FIG. 2 is a diagram showing a mapping described by Cox et al. (hereinafter referred to as Cox) for the case where $v=1$ and $m=4$.

The code C is a linear code over $GF(q)$ of length $mN$, dimension $(m-v)K_1 + vK_2$, and a minimum distance of min $\{(v+1)d_1, d_2\}$ FIG. 2 is a diagram showing a mapping described by Cox et al. (hereinafter referred to as Cox) for the case where $v=1$ and $m=4$. In FIG. 2, $m=4$ and $v=1$, but the equations associated with Cox described below are for the case where $v=1$ (i.e., m is not a particular value in the equations). $g_1(x)$ and $g_2(x)$ are the generator polynomials of $C_1$ and $C_2$, respectively. $\alpha_0(x), \alpha_1(x), \ldots, \alpha_{m-1}(x)$ are the data polynomials (i.e., input data or data prior to encoding). First, $x^{R_2-R_1}\alpha_1(x), x^{R_2-R_1}\alpha_2(x), \ldots, x^{R_2-R_1}\alpha_{m-1}(x)$, are systematically encoded with respect to $g_1(x)$ as follows:

$$c_i(x) = ENC_{g1(x)}(x^{R_2-R_1}\alpha_i(x)) = x^{R_2}\alpha_i(x) + r_i(x), i=1, 2, \ldots, m-1. \quad (2)$$

In Equation 2, $ENC_{g(x)}$ denotes the systematic encoding with respect to the generator polynomial, $g(x)$. In systematic encoding, the input data is embedded in the encoded data (i.e., codeword) that is output. In some cases, input data occupies the beginning portion of the codeword (e.g., <codeword>=<input data><redundant data>). $R_1$ and $R_2$ are the number of redundant bits, bytes, or symbols added by systematically encoding using generator polynomials $g_1(x)$ and $g_2(x)$, respectively.

Returning to Equation 2, $c_i(x)$ is the encoded data that is output where i ranges from 1 to $m-1$, inclusive. For example, in FIG. 2, integrated interleaved encoder 200 includes systematic encoders 202a-202c which are configured to respectively input and systematically encode input data $\alpha_1(x), \alpha_2(x),$ and $\alpha_3(x)$ using $g_1(x)$ (as described by Equation 2). Codewords $c_1(x), c_2(x),$ and $c_3(x)$ are correspondingly output by systematic encoders 202a-202c.

To obtain the remaining codewords, $\Sigma_{i=0}^{m-1}\alpha_i(x)$ is systematically encoded with respect to $g_2(x)$ $$\bar{c}(x) = ENC_{g2(x)}\left(\sum_{i=0}^{m-1} a_i(x)\right) = x^{R_2}\sum_{i=0}^{m-1} a_i(x) + s(x) \quad (3)$$

$\bar{c}(x)$ is an intermediate term and is not output by an integrated interleaved encoder. Returning back to the example of FIG. 2, input data $\alpha_0(x)$ thru $\alpha_3(x)$ (inclusive) are input to adder 204 which outputs a sum (i.e., $\Sigma_{i=0}^{m-1}\alpha_i(x)$). The sum is input to systematic encoder 206 which systematically encodes the sum using $g_2(x)$ and outputs the intermediate term $\bar{c}(x)$ (described by Equation 3).

To obtain the codeword that is actually output according to Cox's technique, the following equation is used:

$$c_0^*(x) = x^{R_2} a_0(x) + s(x) - \sum_{i=1}^{m-1} r_i(x) \quad (4)$$

In Equation 4, $c^*_0 \in C_1$ and $c^*_0 + \Sigma_{i=1}^{m-1} c_i = \bar{c} \in C_2$. Note that $R_2 - R_1$ padded zeros can be removed in the transmission of each component codeword $c_i$, $i=1, 2, \ldots, m-1$, as it is known to the decoder.

Returning to FIG. 2, input data $\alpha_0(x)$ is passed to one input of multiplexer 210. The other input of multiplexer 210 is coupled to the output of adder 208. Adder 208 receives as its inputs the redundant data $s(x)$ output by systematic encoder 206 and the inverted or negative redundant data $r_1(x), r_2(x),$ and $r_3(x)$ that are output by systematic encoders 202a-202c, respectively. The select signal of multiplexer 210 (not shown) is configured to select the appropriate input at the appropriate time. First, the select signal is set so that the input data $\alpha_0(x)$ is passed through to the output. In Equation 4, this corresponds to the term $x^{R_2}\alpha_0(x)$. The select signal then switches to the other input and the output of adder 208 is output. This corresponds to the term $s(x) - \Sigma_{i=1}^3 r_i(x)$ in Equation 4 when $m=4$.

A new mapping for integrated interleaved encoding is described herein. The following figures show some embodiments for certain values of m and/or v. Although some of the equations and figures described below are for the two level case, the techniques described herein can be applied to any number of levels.

Figure 3A:
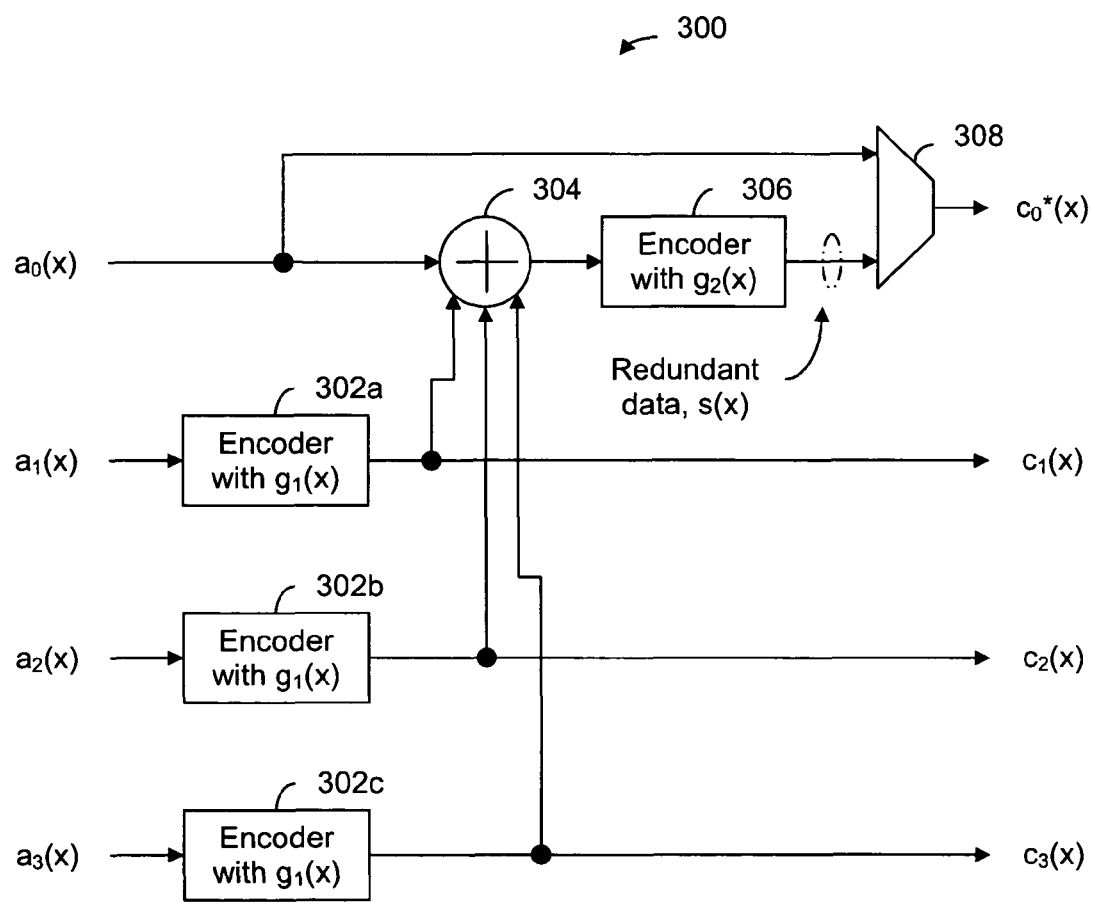
FIG. 3A shows an embodiment of a two level integrated interleaved encoder in which $m=4$ and $v=1$.

FIG. 3A shows an embodiment of a two level integrated interleaved encoder in which $m=4$ and $v=1$. In this embodiment (and other embodiments) $g_1(x)$ and $g_2(x)$ are the generator polynomials of $C_1$ and $C_2$, respectively. The data polynomials (i.e., input data or data prior to encoding) are $\alpha_0(x), \alpha_1(x), \ldots, \alpha_{m-1}(x)$. First, the input data $\alpha_1(x), \alpha_2(x), \ldots, \alpha_{m-1}(x)$ is systematically encoded with respect to $g_1(x)$:

$$c_i(x) = ENC_{g1(x)}(\alpha_i(x)) = x^{R_1}\alpha_i(x) + r_i(x), i=1, 2, \ldots, m-1. \quad (5)$$

As used herein, these codewords are referred to as first level codewords and do not include an asterisk (i.e., "*").

In the example of FIG. 3A, integrated interleaved encoder 300 includes systematic encoders 302a-302c, each of which is configured to receive input data $\alpha_1(x), \alpha_2(x),$ and $\alpha_3(x)$, respectively, and systematically encode it with $g_1(x)$. The outputs of systematic encoders 302a-302c are codewords $c_1(x), c_2(x),$ and $c_3(x)$, respectively.

Then, $\alpha_0(x) + \Sigma_{i=1}^{m-1} c_i(x)$ is systematically encoded with respect to $g_2(x)$ to obtain the following intermediate value:

$$\bar{c}(x) = ENC_{g2(x)}\left(a_0(x) + \sum_{i=1}^{m-1} c_i(x)\right) = x^{R_2}\left(a_0(x) + \sum_{i=1}^{m-1} c_i(x)\right) + s(x). \quad (6)$$

Referring to the example of FIG. 3A, adder 304 is configured to receive codewords $c_1(x), c_2(x),$ and $c_3(x)$ output by systematic encoders 302a-302c, respectively, as well as input data $\alpha_0(x)$. Note that unlike integrated interleaved encoder 200 of FIG. 2, an entire piece of encoded data is used in the summation, not just the redundant data portion. The output of adder 304 is passed to systematic encoder 306 which performs systematic encoding using $g_2(x)$.

To obtain the remaining codeword, the following equation is used:

$$c^*_0(x) = x^{R_2}\alpha_0(x) + s(x) \qquad (7)$$

The codeword $c^*_0(x)$ is referred to as a second level codeword and indicated by the asterisk. In this particular example (i.e., $v=1$) the second level has a single component codeword. In cases where $v>1$, the second level (or other level) has a plurality of component codewords. Some examples are described in further detail below. In Equation 7, it can be observed that $c^*_0 \in C_1$ and $c^*_0(x) + x^{R_2}\sum_{i=1}^{m-1} c_i(x) = \bar{c}(x)$ is a codeword polynomial in $C_2$.

Returning to FIG. 3A, multiplexer 308 is configured to receive as an input the input data $\alpha_0(x)$. Initially, the select signal of multiplexer 308 (not shown) is configured to select this input since the codeword $c^*_0(x)$ (at least in this example) has the input data (i.e., $\alpha_0(x)$) as its beginning portion. In Equation 7, this corresponds to the term $x^{R_2}\alpha_0(x)$. The other input of multiplexer 308 is coupled to the output of systematic encoder 306. The select signal (not shown) of multiplexer 308 switches over and selects the redundant data output by systematic encoder 306; this corresponds to the term $s(x)$ in Equation 7.

Integrated interleaved encoder 300 in some applications is more desirable than integrated interleaved encoder 200 in FIG. 2. (Note that given the same input data and the same generator polynomials, integrated interleaved encoders 200 and 300 will output different codewords but the strengths are the same since the codebook is the same.) One aspect when comparing the two integrated interleaved encoders is the number of adders. Integrated interleaved encoder 200 has two adders whereas integrated interleaved encoder 300 has only one adder. Also, the type of (e.g., arithmetic) operations performed is different. Adder 208 is actually performing subtraction whereas adder 304 performs addition. In some embodiments, subtraction is more computationally difficult and/or has a longer latency compared to addition when implemented in hardware.

Figure 3B:
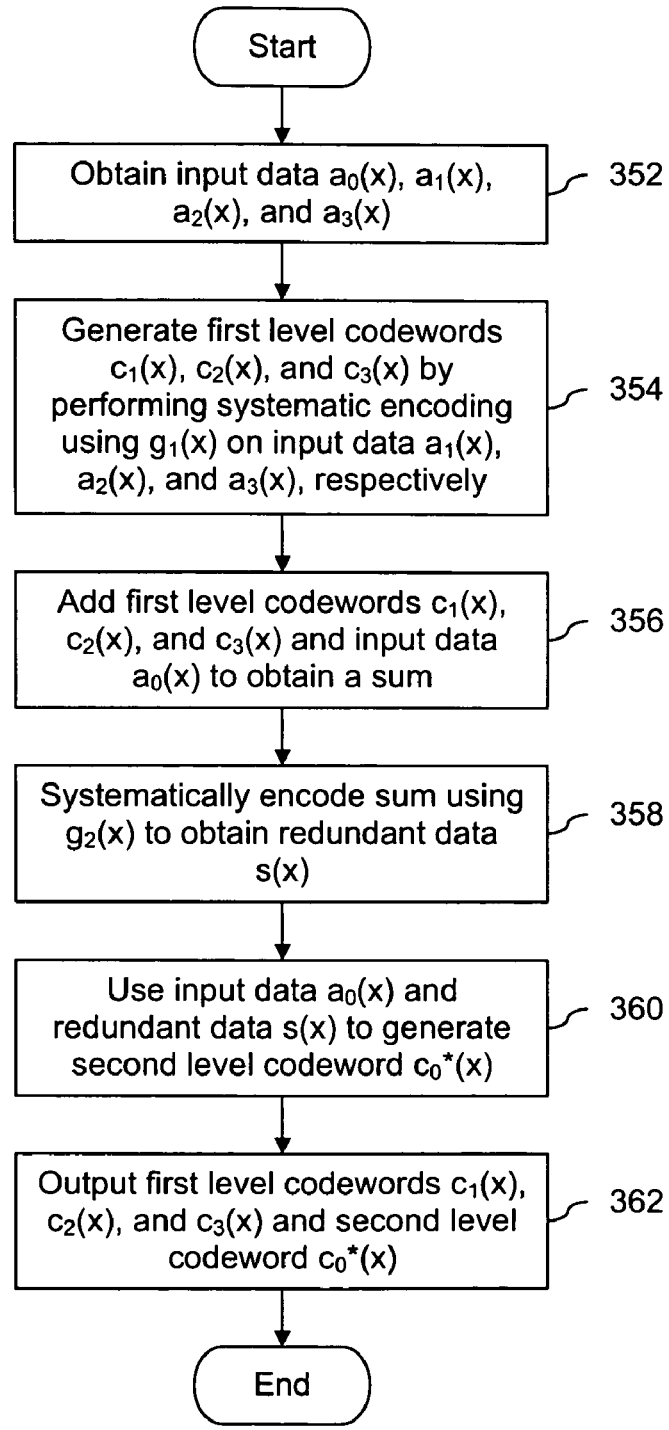
FIG. 3B is flowchart illustrating an embodiment of a process for two level integrated interleaving encoding where $m=4$ and $v=1$.

FIG. 3B is flowchart illustrating an embodiment of a process for two level integrated interleaving encoding where $m=4$ and $v=1$. Flowchart 350 corresponds to system 300 of FIG. 3A. At 352, input data $\alpha_0(x)$, $\alpha_1(x)$, $\alpha_2(x)$, and $\alpha_3(x)$ are obtained. First level codewords $c_1(x)$, $c_2(x)$, and $c_3(x)$ are generated by performing systematic encoding using $g_1(x)$ on input data $\alpha_1(x)$, $\alpha_2(x)$, and $\alpha_3(x)$, respectively, at 354. At 356, first level codewords $c_1(x)$, $c_2(x)$, and $c_3(x)$ and input data $\alpha_0(x)$ are added to obtain a sum. The sum is systematically encoded using $g_2(x)$ to obtain redundant data $s(x)$ at 358. Input data $\alpha_0(x)$ and redundant data $s(x)$ are used to generate second level codeword $c^*_0(x)$ at 360. At 362, first level codewords $c_1(x)$, $c_2(x)$, and $c_3(x)$ and second level codeword $c^*_0(x)$ are output.

Figure 4:
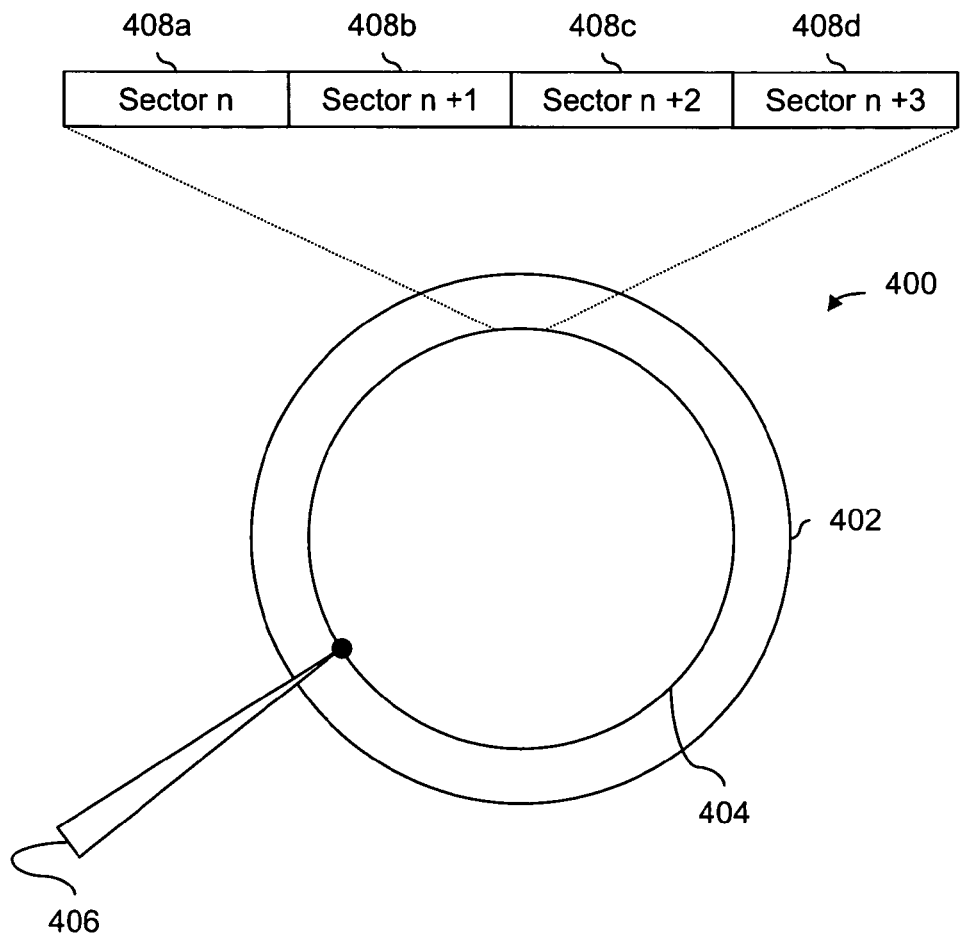
FIG. 4 shows an embodiment of sectors associated with a disk drive system.

FIG. 4 shows an embodiment of sectors associated with a disk drive system. In some embodiments, integrated interleaved encoded data (e.g., output by encoder 300 of FIG. 3A) is stored in disk drive system 400. Disk drive system 400 includes disk 402. Disk 402 includes a plurality of concentric tracks, one of which is shown (i.e., track 404). Arm 406 writes data to and reads data from disk 402. Referring back to the example of FIG. 1, the read/write signal may be passed between arm 406 and controller 112. The position of arm 406 may also be controlled by controller 112.

Track 404 includes a plurality of sectors, four of which are shown. In some embodiments, integrated interleaved encoded data is stored in a sector. For example, sectors 408a-408d may store $c_1(x)$, $c_2(x)$, $c_3(x)$, and $c^*_0(x)$, respectively. In some embodiments, codewords are stored in sectors in some other arrangement or order (e.g., sectors 408a-408d store codewords $c^*_0(x)$, $c_1(x)$, $c_2(x)$, and $c_3(x)$, respectively). System 400 is merely one example.

The technique described above for the particular case of $v=1$ is described below for cases where $v>1$. The input data $\alpha_v(x)$, $\alpha_{v+1}(x)$, ..., $\alpha_{m-1}(x)$ is systematically encoded with respect to $g_1(x)$ to obtain the first level codewords for $i=v, v+1, \ldots, m-1$:

$$c_i(x) = ENC_{g1(x)}(\alpha_i(x)) = x^{R_1}\alpha_i(x) + r_i(x), \ i=v, v+1, \ldots, m-1. \qquad (8)$$

Systematic encoding is then applied using $g_2(x)$:

$$\bar{c}_j(x) = ENC_{g2(x)}\left(\sum_{i=0}^{v-1}\alpha^{ji}a_i(x) + \sum_{i=v}^{m-1}\alpha^{ji}c_i(x)\right) = \qquad (9)$$
$$x^{R_2}\left(\sum_{i=0}^{v-1}\alpha^{ji}a_i(x) + \sum_{i=v}^{m-1}\alpha^{ji}c_i(x)\right) + s_j(x),$$

to obtain the intermediate value $\bar{c}_j(x)$ for $j=0, 1, 2, \ldots, v-1$. In Equation 9, $\alpha$ is a scaling factor (i.e., constant) and does not "shift" any terms in a polynomial.

To obtain the second level codeword(s), the following equation is used:

$$c^*_j(x) \triangleq x^{R_2}\alpha_j(x) + r^*_j(x), j=0,1,2,\ldots,v-1, \qquad (10)$$

where $r^*_j(x)$ are determined so that they satisfy the following constraint:

$$\bar{c}_j(x) = x^{R_2}\sum_{i=v}^{m-1}\alpha^{ji}c_i(x) + \sum_{i=0}^{v-1}\alpha^{ji}c^*_i(x), \ j=0, 1, 2, \ldots, v-1, \qquad (11)$$

which yields the following system of equations:

$$\begin{cases} \sum_{i=0}^{v-1}c^*_i(x) &= x^{R_2}\sum_{i=0}^{v-1}a^i(x) + s_0(x) \\ \sum_{i=0}^{v-1}\alpha^i c^*_i(x) &= x^{R_2}\sum_{i=0}^{v-1}\alpha^i a_i(x) + s_1(x) \\ \sum_{i=0}^{v-1}\alpha^{2i}c^*_i(x) &= x^{R_2}\sum_{i=0}^{v-1}\alpha^{2i}a_i(x) + s_2(x) \\ \quad \vdots \\ \sum_{i=0}^{v-1}\alpha^{(v-1)i}c^*_i(x) &= x^{R_2}\sum_{i=0}^{v-1}\alpha^{(v-1)i}a_i(x) + s_{v-1}(x) \end{cases} \qquad (12)$$

The above system of equations can be simplified by substituting Equation 10 as follows:

$$\begin{cases} \sum_{i=0}^{v-1}r^*_i(x) &= s_0(x) \\ \sum_{i=0}^{v-1}\alpha^i r^*_i(x) &= s_1(x) \\ \sum_{i=0}^{v-1}\alpha^{2i}r^*_i(x) &= s_2(x) \\ \quad \vdots \\ \sum_{i=0}^{v-1}\alpha^{(v-1)i}r^*_i(x) &= s_{v-1}(x) \end{cases} \qquad (13)$$

Therefore, the following explicit expression is obtained:

$$\begin{pmatrix} r_0^*(x) \\ r_1^*(x) \\ r_2^*(x) \\ \vdots \\ r_{\nu-1}^*(x) \end{pmatrix} = \begin{pmatrix} 1 & 1 & 1 & \ldots & 1 \\ 1 & \alpha & \alpha^2 & \ldots & \alpha^{\nu-1} \\ 1 & \alpha^2 & \alpha^4 & \ldots & \alpha^{2(\nu-1)} \\ \vdots & \vdots & \vdots & \vdots & \vdots \\ 1 & \alpha^{\nu-1} & \alpha^{2(\nu-1)} & \ldots & \alpha^{(\nu-1)^2} \end{pmatrix}^{-1} \begin{pmatrix} s_0(x) \\ s_1(x) \\ s_2(x) \\ \vdots \\ s_{\nu-1}(x) \end{pmatrix} \quad (14)$$

The degree of $r^*_i(x)$ are bounded by the degrees of $s_j(x)$, $j=0, 1, 2, \ldots, \nu-1$. Thus, $c^*_i(x)$, $i=0, 1, 2, \ldots, \nu-1$, defined in Equation 10, are in systematic form.

It is next shown that $c^*_0, c^*_1, \ldots, c^*_{\nu-1} \in C_1$. Recall that $\bar{c}_j(x)$, $j=0,1,2,\ldots,\nu-1$ and $c_i(x)$, $i=\nu, \nu+1, \ldots, m-1$ all divide into $g_1(x)$, thus, Equation 11 can be interpreted as follows:

$$\begin{cases} c_0^*(x) + c_1^*(x) + \ldots + c_{\nu-1}^*(x) = 0 \pmod{g_1(x)} \\ c_0^*(x) + \alpha c_1^*(x) + \ldots + \alpha^{\nu-1} c_{\nu-1}^*(x) = 0 \pmod{g_1(x)} \\ c_0^*(x) + \alpha^2 c_1^*(x) + \ldots + \alpha^{2(\nu-1)} c_{\nu-1}^*(x) = 0 \pmod{g_1(x)} \\ \vdots \\ c_0^*(x) + \alpha^{\nu-1} c_1^*(x) + \ldots + \alpha^{(\nu-1)^2} c_{\nu-1}^*(x) = 0 \pmod{g_1(x)} \end{cases}$$

which is equivalent to:

$$\begin{pmatrix} 1 & 1 & 1 & \ldots & 1 \\ 1 & \alpha & \alpha^2 & \ldots & \alpha^{\nu-1} \\ 1 & \alpha^2 & \alpha^4 & \ldots & \alpha^{2(\nu-1)} \\ \vdots & \vdots & \vdots & \vdots & \vdots \\ 1 & \alpha^{\nu-1} & \alpha^{2(\nu-1)} & \ldots & \alpha^{(\nu-1)^2} \end{pmatrix} \begin{pmatrix} c_0^*(x) \pmod{g_1(x)} \\ c_1^*(x) \pmod{g_1(x)} \\ c_2^*(x) \pmod{g_1(x)} \\ \vdots \\ c_{\nu-1}^*(x) \pmod{g_1(x)} \end{pmatrix} = \begin{pmatrix} 0 \\ 0 \\ 0 \\ \vdots \\ 0 \end{pmatrix}.$$

Note the above matrix is a Vandermonde matrix and thus is non-singular. Therefore, $$c^*_j(x) = 0 \pmod{g_1(x)}, j=0,1,2,\ldots,\nu-1. \quad (15)$$

It is thus concluded that $c=[c^*_0, \ldots, c^*_{\nu-1}, c^*_\nu, \ldots, c^*_{m-1}]$ (following the construction of Equations 8, 10, and 14) is a desired codeword.

Next, Equations 9 and 14 are consolidated into one step. $\tilde{r}_j(x)$, $j=0, 1, \ldots, \nu-1$ is the check polynomial of $\alpha_j(x)$ associated with $g_2(x)$ and $\tilde{r}_j(x)$, $j=\nu, \nu+1, \ldots, m-1$ is the check polynomial of $c_j(x)$ associated with $g_1(x)$ (herein we use the same notation for brevity). The following equality results:

$$\begin{pmatrix} s_0(x) \\ s_1(x) \\ s_2(x) \\ \vdots \\ s_{\nu-1}(x) \end{pmatrix} = \begin{pmatrix} 1 & 1 & 1 & \ldots & 1 \\ 1 & \alpha & \alpha^2 & \ldots & \alpha^{m-1} \\ 1 & \alpha^2 & \alpha^4 & \ldots & \alpha^{2(m-1)} \\ \vdots & \vdots & \vdots & \vdots & \vdots \\ 1 & \alpha^{\nu-1} & \alpha^{2(\nu-1)} & \ldots & \alpha^{(\nu-1)(m-1)} \end{pmatrix}^{-1} \begin{pmatrix} \tilde{r}_0(x) \\ \tilde{r}_1(x) \\ \tilde{r}_2(x) \\ \vdots \\ \tilde{r}_{m-1}(x) \end{pmatrix} \quad (16)$$

Combining Equations 14 and 16 results in:

$$\begin{pmatrix} r_0^*(x) \\ r_1^*(x) \\ r_2^*(x) \\ \vdots \\ r_{\nu-1}^*(x) \end{pmatrix} = (I_\nu | P) \begin{pmatrix} \tilde{r}_0(x) \\ \tilde{r}_1(x) \\ \tilde{r}_2(x) \\ \vdots \\ \tilde{r}_{m-1}(x) \end{pmatrix} \quad (17)$$

where $I_\nu$ denotes the $\nu \times \nu$ identity matrix and $$P = \begin{pmatrix} 1 & 1 & 1 & \ldots & 1 \\ 1 & \alpha & \alpha^2 & \ldots & \alpha^{\nu-1} \\ 1 & \alpha^2 & \alpha^4 & \ldots & \alpha^{2(\nu-1)} \\ \vdots & \vdots & \vdots & \vdots & \vdots \\ 1 & \alpha^{\nu-1} & \alpha^{2(\nu-1)} & \ldots & \alpha^{(\nu-1)^2} \end{pmatrix}^{-1} \quad (18)$$

$$\begin{pmatrix} 1 & 1 & \ldots & 1 \\ \alpha^\nu & \alpha^{\nu+1} & \ldots & \alpha^{m-1} \\ \alpha^{2\nu} & \alpha^{2(\nu+1)} & \ldots & \alpha^{2(m-1)} \\ \vdots & \vdots & \vdots & \vdots \\ \alpha^{(\nu-1)\nu} & \alpha^{(\nu-1)(\nu+1)} & \ldots & \alpha^{(\nu-1)(m-1)} \end{pmatrix}.$$

Note that a linear combination of the check polynomial is equal to the check polynomial of the same linear combination of their corresponding data polynomials. Consequently, $r^*_0(x), r^*_1(x), \ldots, r^*_{\nu-1}(x)$, are produced by $$[r^*_0(x) r^*_1(x) \ldots r^*_{\nu-1}(x)]^T = CHK_{g2(x)}([I_\nu, P] \cdot [\alpha_0(x) \ldots \alpha_{\nu-}(x) c_\nu(x) \ldots c_{m-1}(x)]^T) \quad (19)$$

where $CHK_{g(x)}$ denotes the check polynomial generator associated with generator polynomial $g(x)$.

In summary, Equations 8 and 19 describe some embodiments of a new mapping method. Compared to some other mappings, the size and/or latency when implemented in hardware is more attractive compared to some other techniques.

From the above analysis, the integrated interleaving can be extended to cases where $\nu > 1$ using the following equations:

$$[c_\nu(x) c_{\nu+1}(x) \ldots c_{m-1}(x)]^T = ENC_{g1(x)}(x^{R_2-R_1}[\alpha_\nu(x) \alpha_{\nu+1}(x) \ldots \alpha_{m-1}(x)]^T) \quad (20)$$

$$[c_0^*(x) c_1^*(x) \ldots c_{\nu-1}^*(x)]^T = \quad (21)$$
$$ENC_{g2(x)}([I_\nu P] \cdot [a_0(x) a_1(x) \ldots a_{m-1}(x)]^T) - $$
$$P \cdot [c_\nu(x) c_{\nu+1}(x) \ldots c_{m-1}(x)]^T$$

where P is as defined in Equation 18. Equation 20 is used to generate the first level codewords $c_\nu(x), \ldots, c_{m-1}(x)$ and Equation 21 is used to generate the second level codewords $c^*_0(x), \ldots, c^*_{\nu-1}(x)$.

Figure 5:
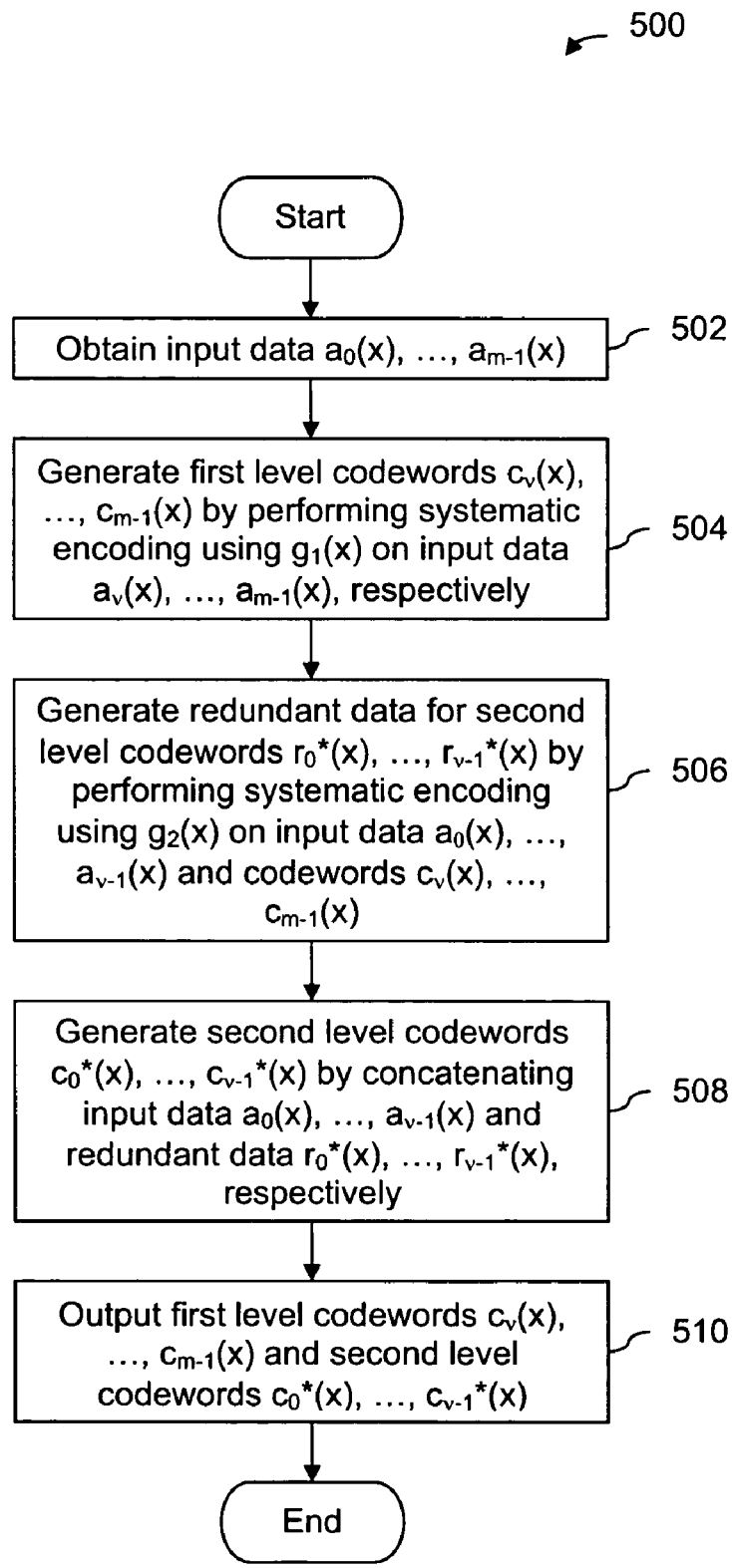
FIG. 5 is a flowchart illustrating an embodiment for a two level integrated interleaved code where $v>1$.

FIG. 5 is a flowchart illustrating an embodiment for a two level integrated interleaved code where $\nu > 1$. In flowchart 500, input data $\alpha_0(x), \alpha_1(x), \ldots, \alpha_{m-1}(x)$ is obtained at 502. At 504, first level codewords $c_\nu(x), \ldots, c_{m-1}(x)$ are generated by performing systematic encoding using $g_1(x)$ on input data $\alpha_\nu(x), \ldots, \alpha_{m-1}(x)$, respectively. At 506, redundant data for second level codewords $r^*_0(x), r^*_1(x), \ldots, r^*_{\nu-1}(x)$ is generated by performing systematic encoding using $g_2(x)$ on input data $\alpha_0(x), \ldots, \alpha_{\nu-1}(x)$ and codewords $c_\nu(x), \ldots, c_{m-1}(x)$. In Equation 19, the identity matrix, $I_\nu$, selects the appropriate pieces of input data and P applies scaling or weights as appropriate. Second level codewords $c^*_0(x), \ldots, c^*_{\nu-1}(x)$ are generated at 508 by concatenating input data $\alpha_0(x), \ldots, \alpha_{\nu-1}(x)$ and redundant data $r^*_0(x), \ldots, r^*_{\nu-1}(x)$, respectively. At 510, first level codewords $c_\nu(x), \ldots, c_{m-1}(x)$ and second level codewords $c^*_0(x), \ldots, c^*_{\nu-1}(x)$ are output.

Figure 6A:
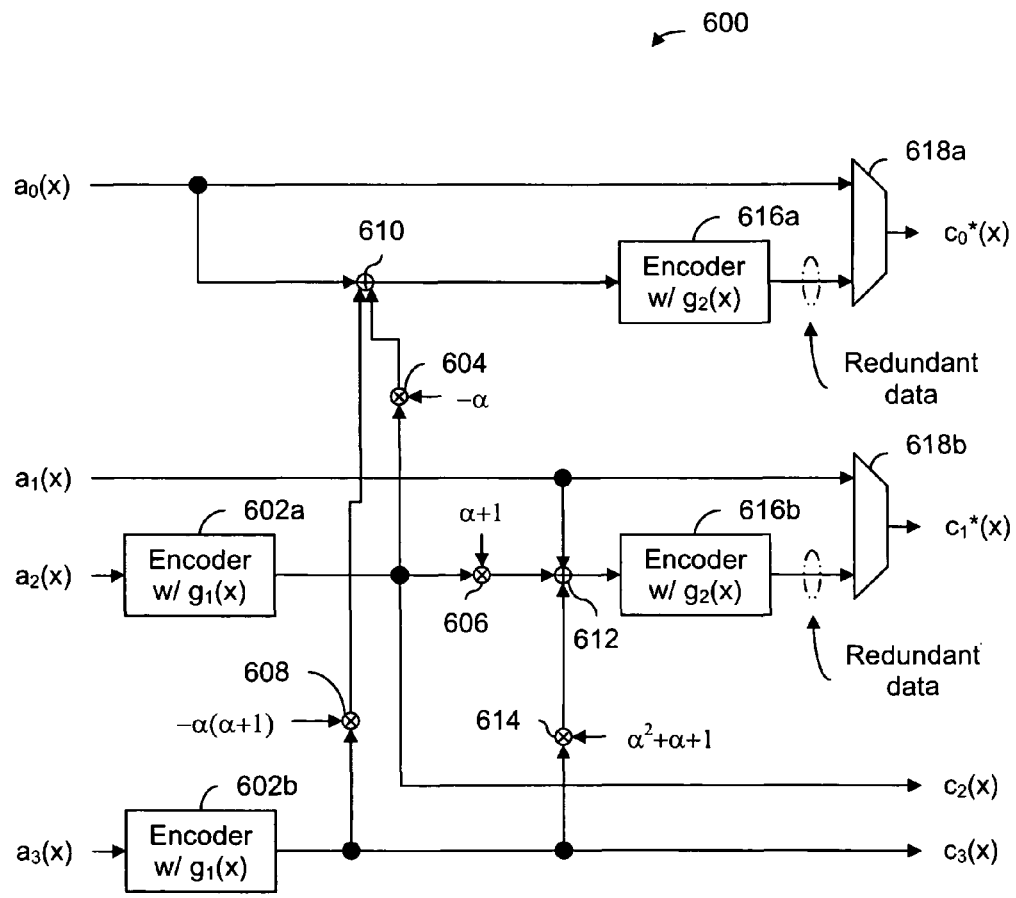
FIG. 6A shows an embodiment of a two level integrated interleaved encoder where $m=4$ and $v=2$.

FIG. 6A shows an embodiment of a two level integrated interleaved encoder where m=4 and $\nu$=2. Integrated interleaved encoder 600 includes systematic encoders 602a-602b which are configured to receive input data $\alpha_2(x)$ and $\alpha_3(x)$, respectively, and systematically encode that data using $g_1(x)$. The outputs of systematic encoders 602a-602b are $c_2(x)$ and $c_3(x)$, respectively.

The first level codeword $c_2(x)$ output by systematic encoder 602a is passed to multiplier 604 and multiplier 606. Multiplier 604 multiplies $c_2(x)$ by $-\alpha$ and multiplier 606 multiples it by $(\alpha+1)$.

The first level codeword $c_3(x)$ output by systematic encoder 602b is passed to multiplier 608 and multiplier 614. Multiplier 608 multiplies $c_3(x)$ by $-\alpha(\alpha+1)$ and multiplier 614 multiples it by $(\alpha^2+\alpha+1)$.

Adder 610 receives as input $\alpha_0(x)$, the output of multiplier 608, and the output of multiplier 604. Adder 612 receives as input $\alpha_1(x)$, the output of multiplier 606, and the output of multiplier 614. The sum output by adder 610 is passed to systematic encoder 616a and is systematically encoded using $g_2(x)$. The sum output by adder 612 is passed to systematic encoder 616b and is systematically encoded using $g_2(x)$.

Input data $\alpha_0(x)$ and $\alpha_1(x)$ are passed to multiplexers 618a and 618b, respectively, as input. The other input of multiplexer 618a is the output of systematic encoder 616a and the other input of multiplexer 618b is the output of systematic encoder 616b. In this particular embodiment, only the redundant data output by systematic encoders 616a and 616b are of interest. The select signals of multiplexers 618a and 618b (not shown) are configured to initially select input data $\alpha_0(x)$ and $\alpha_1(x)$, respectively. Then (at the appropriate time or bit/byte) the select signals of multiplexers 618a and 618b switch over and select the other input (i.e., redundant data output by systematic encoders 616a and 616b, respectively). The outputs of multiplexers 618a and 618b are second level codewords $c^*_0(x)$ and $c^*_1(x)$, respectively.

Figure 6B:
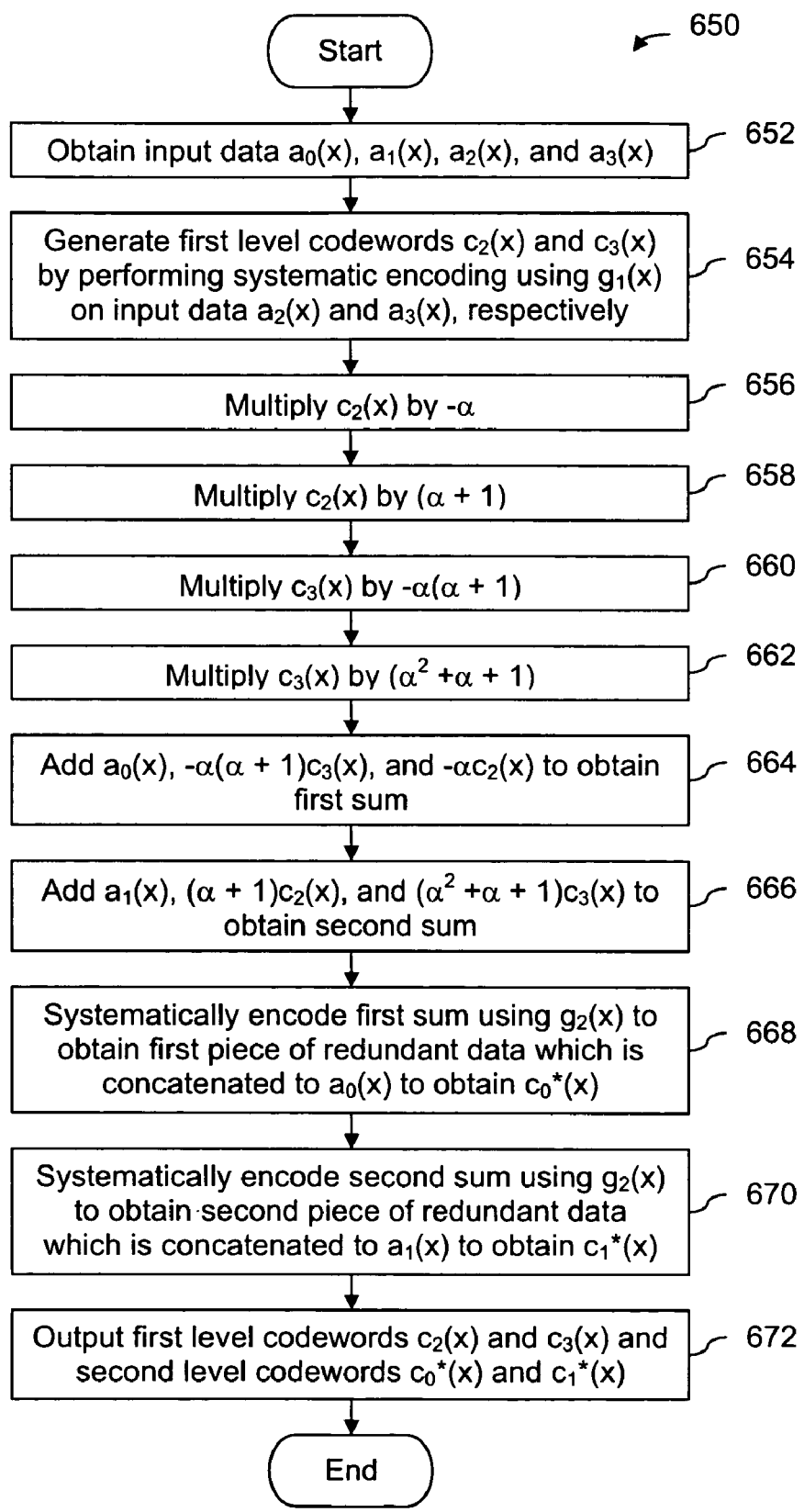
FIG. 6B is a flowchart illustrating an embodiment of a process for a two level integrated interleaved encoder where $m=4$ and $v=2$.

FIG. 6B is a flowchart illustrating an embodiment of a process for a two level integrated interleaved encoder where m=4 and v=2. Process 650 in FIG. 6B corresponds to system 600 shown in FIG. 6A. At 652, input data $\alpha_0(x)$, $\alpha_1(x)$, $\alpha_2(x)$, and $\alpha_3(x)$ are obtained. First level codewords $c_2(x)$ and $c_3(x)$ are generated by performing systematic encoding using $g_1(x)$ on input data $\alpha_2(x)$ and $\alpha_3(x)$, respectively at 654. At 656, $c_2(x)$ is multiplied by $-\alpha$ and at 658, $c_2(x)$ is multiplied by $(\alpha+1)$. At 660, $c_3(x)$ is multiplied by $-\alpha(\alpha+1)$ and at 662, $c_3(x)$ is multiplied by $(\alpha^2+\alpha+1)$. At 664, $\alpha_0(x)$, $-\alpha(\alpha+1)c_3(x)$, and $-\alpha c_2(x)$ are added to obtain a first sum. At 666, $\alpha_1(x)$, $(\alpha+1)c_2(x)$, and $(\alpha^2+\alpha+1)c_3(x)$ are added to obtain a second sum. At 668, the first sum is systematically encoded using $g_2(x)$ to obtain a first piece of redundant data which is concatenated to $\alpha_0(x)$ to obtain $c^*_0(x)$. At 670, the second sum is systematically encoded using $g_2(x)$ to obtain a second piece of redundant data which is concatenated to $\alpha_1(x)$ to obtain $c^{*1}(x)$. The first level codewords $c_2(x)$ and $c_3(x)$ and the second level codewords $c^*_0(x)$ and $c^*_1(x)$ are output at 672.

Although some of the examples described above are for the two level case, the techniques can be applied to three or more levels. The following figure shows some three level examples.

Figure 7:
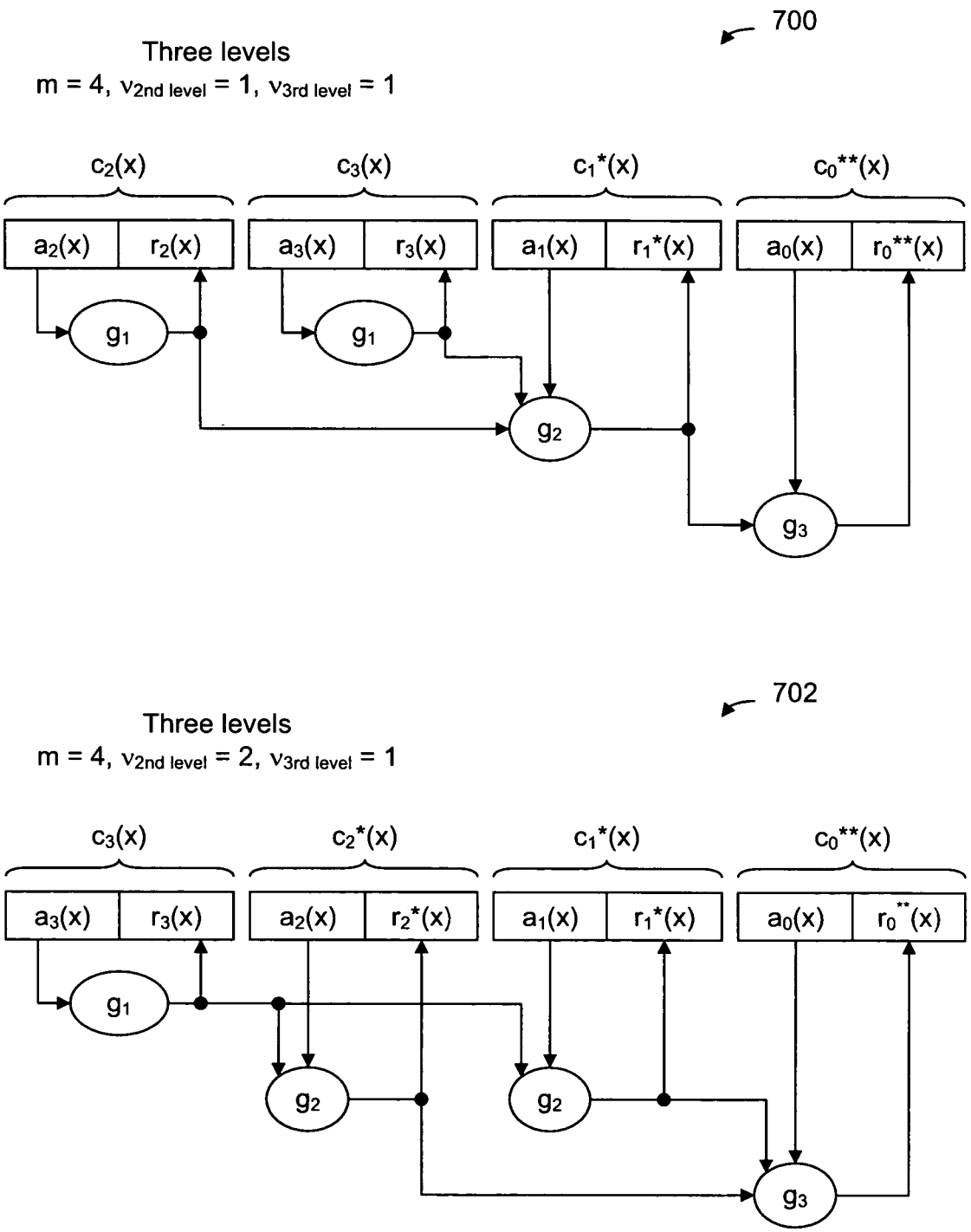
FIG. 7 is a diagram showing two embodiments of three level integrated interleaved encoding.

FIG. 7 is a diagram showing two embodiments of three level integrated interleaved encoding. For clarity, some components (e.g., adders and/or multipliers) are not shown. In the first embodiment (700) m=4. There is one second level codeword (i.e., $v_{2nd\ level}=1$) and there is one third level codeword (i.e., $v_{3rd\ level}=1$). In this example, a single asterisk (i.e., "*") indicates or corresponds to a second level and two asterisks (i.e., "**") indicates or corresponds to a third level. Second level codeword $c^*_1(x)$ is based on its corresponding piece of input data, $\alpha_1(x)$, as well as some or all of the first level codewords $c_2(x)$ and $c_3(x)$ (e.g., just the redundant data or the entire codeword). Third level codeword $c^{**}_0(x)$ is based on its corresponding piece of input data, $\alpha_0(x)$, as well as some or all of second level codeword $c^*_1(x)$ (e.g., just the redundant data or the entire codeword).

The second embodiment (702) is also for the case m=4. In this embodiment there is one codeword at the first level, two codewords at the second level, and one codeword at the third level. Second level codewords $c^*_2(x)$ and $c^*_1(x)$ are each based on their respective piece of input data (i.e., $\alpha_2(x)$ and $\alpha_1(x)$) and some or all of the first level codeword $c_3(x)$. The third level codeword $c^{**}_0(x)$ is based on the input data $\alpha_0(x)$ and some or all of second level codewords $c^*_2(x)$ and $c^*_1(x)$.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for performing integrated interleaved encoding, comprising:
    obtaining a first piece of input data and a second piece of input data;
    systematically encoding the first piece of input data using a first generator polynomial to obtain a first codeword;
    using a processor to generate a second codeword based at least in part on the second piece of input data and the first codeword, including by systematically encoding information based at least in part on the second piece of input data and the first codeword using a second generator polynomial; and
    outputting the first codeword and the second codeword.

2. The method of claim 1, wherein first codeword is associated with a first level and the second codeword is associated a second level.

3. The method of claim 2, wherein the second codeword is the only codeword associated with the second level.

4. The method of claim 2, wherein there is a third codeword associated with a third level.

5. The method of claim 2, wherein there is a third codeword associated with a first level.

6. The method of claim 2, wherein there is a third codeword associated with a second level.

7. The method of claim 1, wherein the second codeword includes the second piece of input data followed by redundant data generated by the systematic encoding process that uses the second generator polynomial.

8. The method of claim 1, wherein generating the second codeword includes using a $v \times v$ identity matrix, $I_v$.

9. The method of claim 1, wherein generating the second codeword includes weighting.

10. The method of claim 9, wherein weighting includes using $$P = \begin{pmatrix} 1 & 1 & 1 & \cdots & 1 \\ 1 & \alpha & \alpha^2 & \cdots & \alpha^{v-1} \\ 1 & \alpha^2 & \alpha^4 & \cdots & \alpha^{2(v-1)} \\ \vdots & \vdots & \vdots & \vdots & \vdots \\ 1 & \alpha^{v-1} & \alpha^{2(v-1)} & \cdots & \alpha^{(v-1)^2} \end{pmatrix}^{-1}$$

$$\begin{pmatrix} 1 & 1 & \cdots & 1 \\ \alpha^v & \alpha^{v+1} & \cdots & \alpha^{m-1} \\ \alpha^{2v} & \alpha^{2(v+1)} & \cdots & \alpha^{2(m-1)} \\ \vdots & \vdots & \vdots & \vdots \\ \alpha^{(v-1)v} & \alpha^{(v-1)(v+1)} & \cdots & \alpha^{(v-1)(m-1)} \end{pmatrix}.$$

11. The method of claim 1, wherein generating the second codeword includes adding.

12. The method of claim 11, wherein adding includes adding the first codeword and the second piece of data.

13. The method of claim 1, wherein generating the second codeword includes multiplying.

14. The method of claim 13, wherein multiplying includes using $(\alpha^2+\alpha+1)$.

15. The method of claim 1 further comprising:
obtaining a third piece of input data; and
systematically encoding the third piece of input data using a first generator polynomial to obtain a third codeword, wherein the first codeword and the third codeword are associated with a same level and generating the second codeword is further based at least in part on the third codeword.

16. The method of claim 15 further comprising:
obtaining a fourth piece of input data; and
generating a fourth codeword based at least in part on the fourth piece of input data, the first codeword, and the third codeword, including by systematically encoding using a second generator polynomial, wherein the second codeword and fourth third codeword are associated with a same level.

17. The method of claim 1 further comprising storing the first codeword and the second codeword that are output.

18. The method of claim 17, wherein storing includes storing on a disk.

19. The method of claim 1 further comprising transmitting the first codeword and the second codeword that are output.

20. The method of claim 19, wherein transmitting includes transmitting over a wireless medium.

21. The method of claim 1, wherein:
the first generator polynomial is associated with a first minimum distance, $d_1$;
the second generator polynomial is associated with a second minimum distance, $d_2$; and
$d_2 \geq d_1$.

22. A system for performing integrated interleaved encoding, comprising:
an input interface configured to obtain a first piece of input data and a second piece of input data;
an encoder configured to systematically encode the first piece of input data using a first generator polynomial to obtain a first codeword;
a codeword generator configured to generate a second codeword based at least in part on the second piece of input data and the first codeword, including by systematically encoding information based at least in part on the second piece of input data and the first codeword using a second generator polynomial; and
an output interface configured to output the first codeword and the second codeword.

23. A computer program product for performing integrated interleaved encoding, the computer program product being embodied in a tangible computer readable storage medium and comprising computer instructions for:
obtaining a first piece of input data and a second piece of input data;
systematically encoding the first piece of input data using a first generator polynomial to obtain a first codeword;
generating a second codeword based at least in part on the second piece of input data and the first codeword, including by systematically encoding information based at least in part on the second piece of input data and the first codeword using a second generator polynomial; and
outputting the first codeword and the second codeword.

\* \* \* \* \*